US008159820B2

(12) United States Patent
Ibori et al.

(10) Patent No.: US 8,159,820 B2
(45) Date of Patent: Apr. 17, 2012

(54) ELECTRIC POWER CONVERSION SYSTEM

(75) Inventors: Satoshi Ibori, Yachimata (JP); Koji Hamano, Narashino (JP); Jiangming Mao, Narashino (JP); Tomoya Kamezawa, Narashino (JP); Masayuki Hirota, Narashino (JP); Masahiro Hiraga, Yotsukaido (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 957 days.

(21) Appl. No.: 12/215,491

(22) Filed: Jun. 26, 2008

(65) Prior Publication Data
US 2009/0034309 A1 Feb. 5, 2009

(30) Foreign Application Priority Data

Jul. 30, 2007 (JP) .................................. 2007-196892

(51) Int. Cl.
*H05K 7/20* (2006.01)
(52) U.S. Cl. ..... 361/695; 361/694; 361/697; 312/223.1; 174/252; 454/184
(58) Field of Classification Search .................. None
See application file for complete search history.

(56) References Cited

U.S. PATENT DOCUMENTS

| 4,399,484 | A | * | 8/1983 | Mayer ........................... 361/689 |
| 5,424,915 | A | * | 6/1995 | Katooka et al. ............... 361/695 |
| 6,052,282 | A | * | 4/2000 | Sugiyama et al. ............ 361/690 |
| 6,226,182 | B1 | * | 5/2001 | Maehara ....................... 361/695 |
| 6,538,885 | B1 | * | 3/2003 | Azar .............................. 361/695 |
| 7,218,517 | B2 | * | 5/2007 | Wolford et al. ............... 361/695 |
| 7,817,419 | B2 | * | 10/2010 | Illerhaus ....................... 361/692 |
| 7,929,301 | B2 | * | 4/2011 | Fong et al. .................... 361/695 |
| 2006/0104027 | A1 | * | 5/2006 | Vinson et al. ................. 361/695 |
| 2006/0133036 | A1 | * | 6/2006 | Durney .......................... 361/695 |

FOREIGN PATENT DOCUMENTS

| JP | 07-095771 | 4/1995 |
| JP | 09-237992 | 9/1997 |
| JP | 2000-174474 A | 6/2000 |

OTHER PUBLICATIONS

China State Intellectual Property Office (SIPO) office action for SIPO patent application CN200810125002A (Nov. 5, 2010).

* cited by examiner

*Primary Examiner* — Courtney Smith
(74) *Attorney, Agent, or Firm* — Kilpatrick Townsend & Stockton LLP

(57) ABSTRACT

In the present invention, miniaturization of an electric power conversion system is made possible while the reduction of a rise in temperature is achieved through a cooling operation by a cooling fan. The electric power conversion system is provided with a casing for covering cooling fins for cooling power semiconductors, a main circuit board having a driver circuit for driving the power semiconductors, and a cover for covering up the main circuit board. The system includes a first airflow hole provided at a part of the main circuit board, on the upper side of an air-intake provided in the cover, and a second airflow hole provided on the lower side of the first airflow hole, and on the lower side of the cooling fins, wherein air from the second airflow hole is driven to the cooling fins by a cooling fan.

8 Claims, 9 Drawing Sheets (a)

(b)

(a)

(b)

ELECTRIC POWER CONVERSION SYSTEM

CROSS-REFERENCES TO RELATED APPLICATIONS

The present application claims priority from Japanese application serial no. JP 2007-196892, filed on Jul. 30, 2007, the content of which is hereby incorporated by reference into this application.

BACKGROUND OF THE INVENTION

The invention relates to an electric power conversion system.

Inverters are a type off electric power conversion systems that have been in widespread use as speed controllers of motors in both industrial apparatuses and household appliance products. However, power semiconductors for use in power conversion, such as IGBTs used in such electric power conversion systems, generate heat due to electrical energy loss at the time of power conversion, and the power semiconductors therefore normally have a predetermined operating temperature limit. If power semiconductors continue to generate heat after their temperature exceeds the operating temperature limit, the risk arises that the power semiconductors may stop operation. Therefore, in such a case, there is a need for the electric power conversion system to include a structure for cooling the power semiconductors. More specifically, an air cooling method is facilitated by an electric power conversion system that is provided with cooling fins, and a cooling fan, so that heat from the power semiconductors, acting as heating elements, is conducted to the cooling fins, and air is sent out to the cooling fins by the cooling fan to cause heat exchange to take place.

In the paragraph (0019) of JP-A No. 9 (1997)-237992, a description is given of a masking shield 7 that serves as a shielding member between a main circuit 4, and a logical block 5 to thereby prevent air from either side to flow in, to eliminate a gap therebetween as much as possible, and to enable the masking shield 7 to have both a thermal insulation and magnetic shielding effect. The main circuit side of a system is respectively made up of an insulation material 9 while the logical block of the system is made up of a steel sheet 8 or the like. Furthermore, an air duct serving as a coolant path is provided therebetween, and the thermal insulation effect is furthered by causing air to flow through this air duct. In this configuration, the main circuit 4, and the logical block 5 are provided in chambers independent from each other.

BRIEF SUMMARY OF THE INVENTION

In the case of the conventional technology described above, sufficient consideration has not been given to enhanced cooling operation efficiency through natural air-cooling, and therefore the technology has exhibited an inability to ensure sufficient compatibility between the control of rise in temperature, and miniaturization of the system. More specifically, if, for example, the density of elements mounted on a circuit board is increased in order to implement the miniaturization of the system, this will impede cooling with a cooling fan and raise the temperature inside the system, thereby risking a shortening of the lifetime of the elements.

Further, while conventional technology provides a shielding member between the main circuit and the logical block in order to prevent the heat of the main circuit from being transferred along with air flowing to the logical block (which is susceptible to heat), the problem with such conventional technology has been that the cooling operation meant to reduce the heat generated by the logical block itself has been insufficient.

It is therefore an object of the invention to enhance the cooling performance of an electric power conversion system while implementing miniaturization thereof.

To that end, in accordance with one aspect of the invention, an electric power conversion system is provided that includes power semiconductors; fins for releasing heat from the power semiconductors; a circuit board having a driver circuit for driving the power semiconductors; a casing for covering the fins disposed between the fins and the circuit board, and having a cutout part through which the power semiconductors are inserted and an airflow hole through which air from the circuit board is driven; a cover combined with the casing, for covering the circuit board; and a fan for causing the air from the circuit board to flow to the fins through the airflow hole.

When the electric power conversion system is installed on the wall, the airflow hole is preferably provided at a part of the casing on the lower side of the fins. Further, the airflow hole is preferably provided on a front face of the casing.

Therefore the present invention enhances the cooling performance of the electric power conversion system while implementing the miniaturization thereof.

BRIEF DESCRIPTION OF THE DRAWINGS

These and other features, objects and advantages of the present invention will become apparent from the following description when taken in conjunction with the accompanying drawings wherein:

FIG. 1(a) is a perspective view of an embodiment of an electric power conversion system according to the invention when the system is installed while FIG. 1(b) is an exploded view of the electric power conversion system;

DETAILED DESCRIPTION OF THE INVENTION

Figure 1:
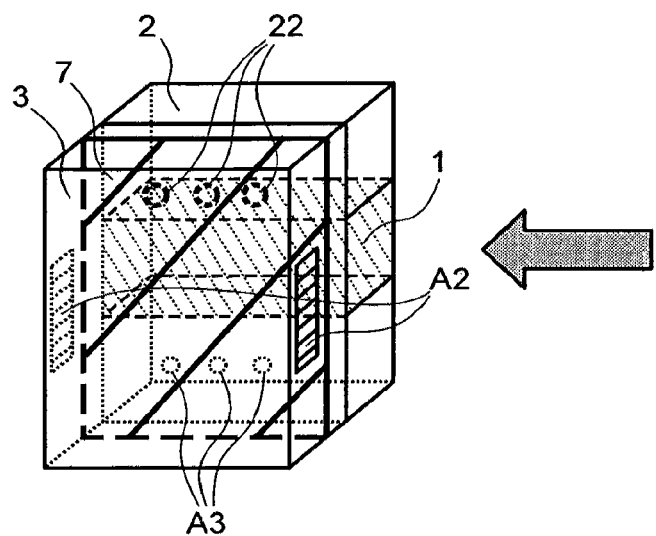
Figure 1:
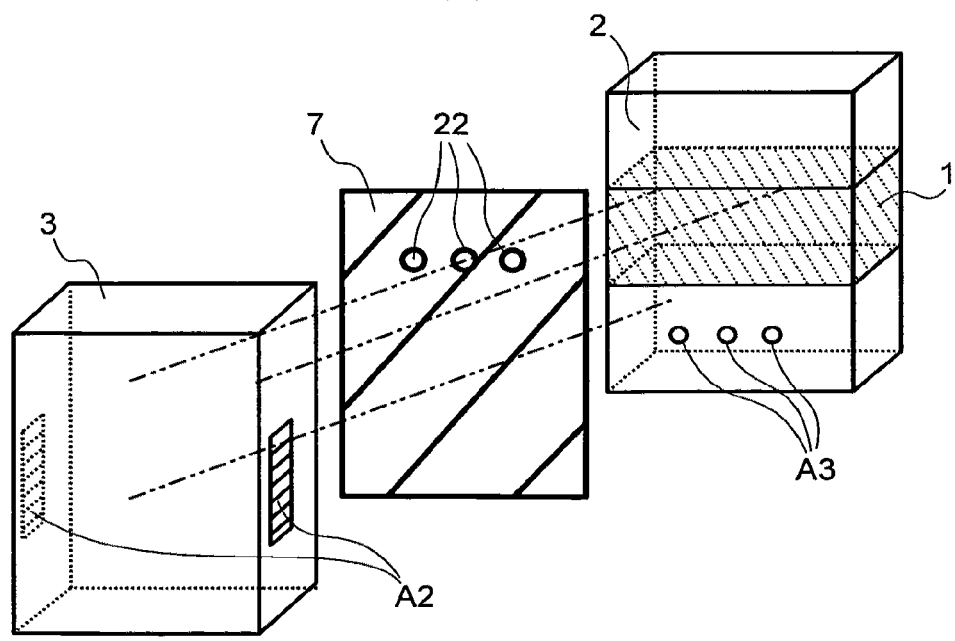

While several embodiments in accordance with the invention are shown and described, it should be understood that changes and modifications may be made to the disclosed embodiments without departing from the scope of the invention. Accordingly, the following description should not be taken as limiting the scope of the invention, which is defined in the claims.

A specific embodiment of the invention is described hereinafter with reference to FIGS. 1 to 7.

An embodiment of an electric power conversion system according to the invention is described hereinafter. FIG. 1(a) is a schematic perspective view of the electric power conversion system according to the present embodiment, and FIG. 1(b) is a schematic exploded view thereof. FIG. 1(a) is the perspective view of the system when installed, and the system is assembled by connecting a body cover (cover 3) at the front of the system with a body case (casing 2) on the back side thereof. Further, FIG. 1(b) is an exploded view of the system, in which the cover 3 covers a main circuit board 7 to be connected with the casing 2. As shown in FIG. 1(b), the cover 3 is provided with air-intakes (vent hole slits A2) formed on both side faces thereof, the main circuit board 7 is provided with first airflow holes (notched through-holes 22, FIG. 7) formed in an upper part thereof, and the casing 2 is provided with second airflow holes (notched vent holes A3)) formed on a front face thereof.

Cooling fins (fins 1) are provided inside the casing 2, and a power semiconductor 11 (not shown) is installed in the fins, thereby enabling the fins to play a role in releasing heat from the power semiconductor 11.

Figure 2:
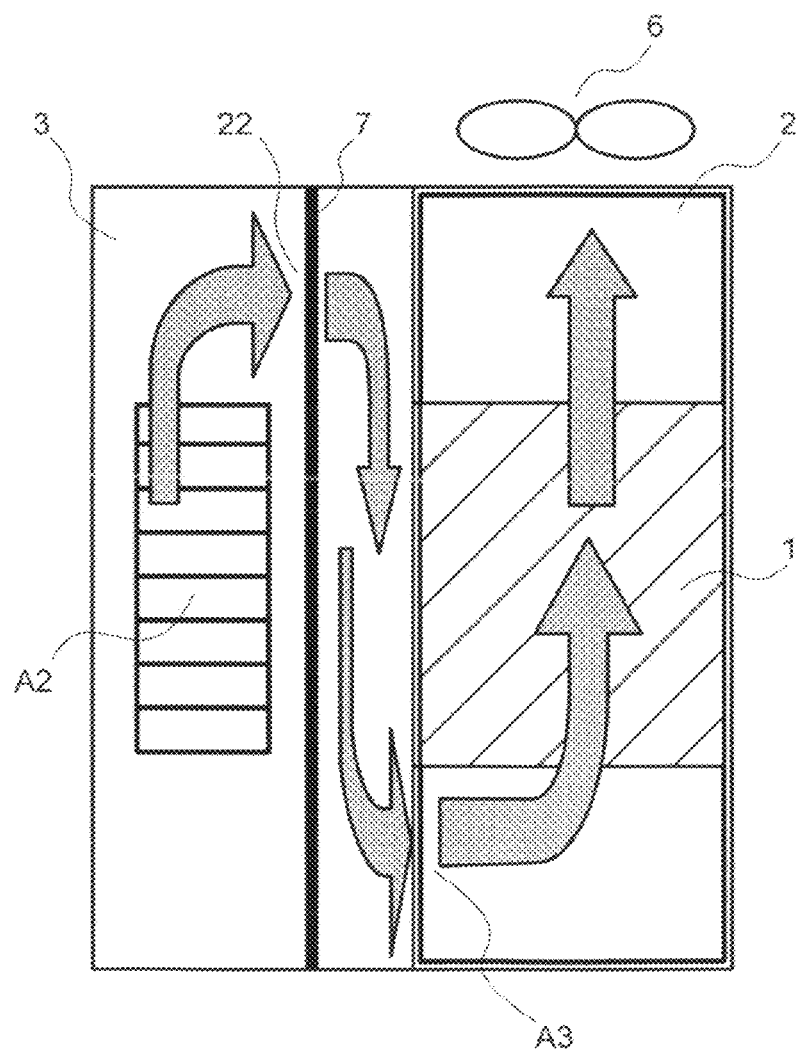
FIG. 2 is a side view of the electric power conversion system according to an embodiment of the invention (as seen from a direction indicated by an arrow shown in FIG. 1(a))

FIG. 2 is a side view of the electric power conversion system as seen from a direction indicated by an arrow shown in FIG. 1(a). Airflow inside the system according to the present embodiment is described below. Cooling fans (fans 6) are provided in an upper part of the casing 2 so as to execute an operation for drawing air from inside the casing, so that air from the cooling fins 1 is driven toward the cooling fans 6, thereby causing heat release to take place at the power semiconductor 11 (not shown). Further, arrows shown in FIG. 2 indicate the airflow inside the electric power conversion system according to the present embodiment. More specifically, the cooling fans 6 provided in the upper part of the casing 2 are intended to execute the operation for taking out air, where outside air enters the air-intakes A2 (air present in the space between the cover 3, and the main circuit board 7) passes through the notched through-holes 22 of the main circuit board 7 to subsequently pass through space between the main circuit board 7, and the casing 2 before passing through the second airflow holes A3 to be exhausted to the outside of the system by the cooling fans 6. The positional relationship among those airflow holes, and the air-intakes, and the operational function of the airflow will be described in detail below.

Figure 3:
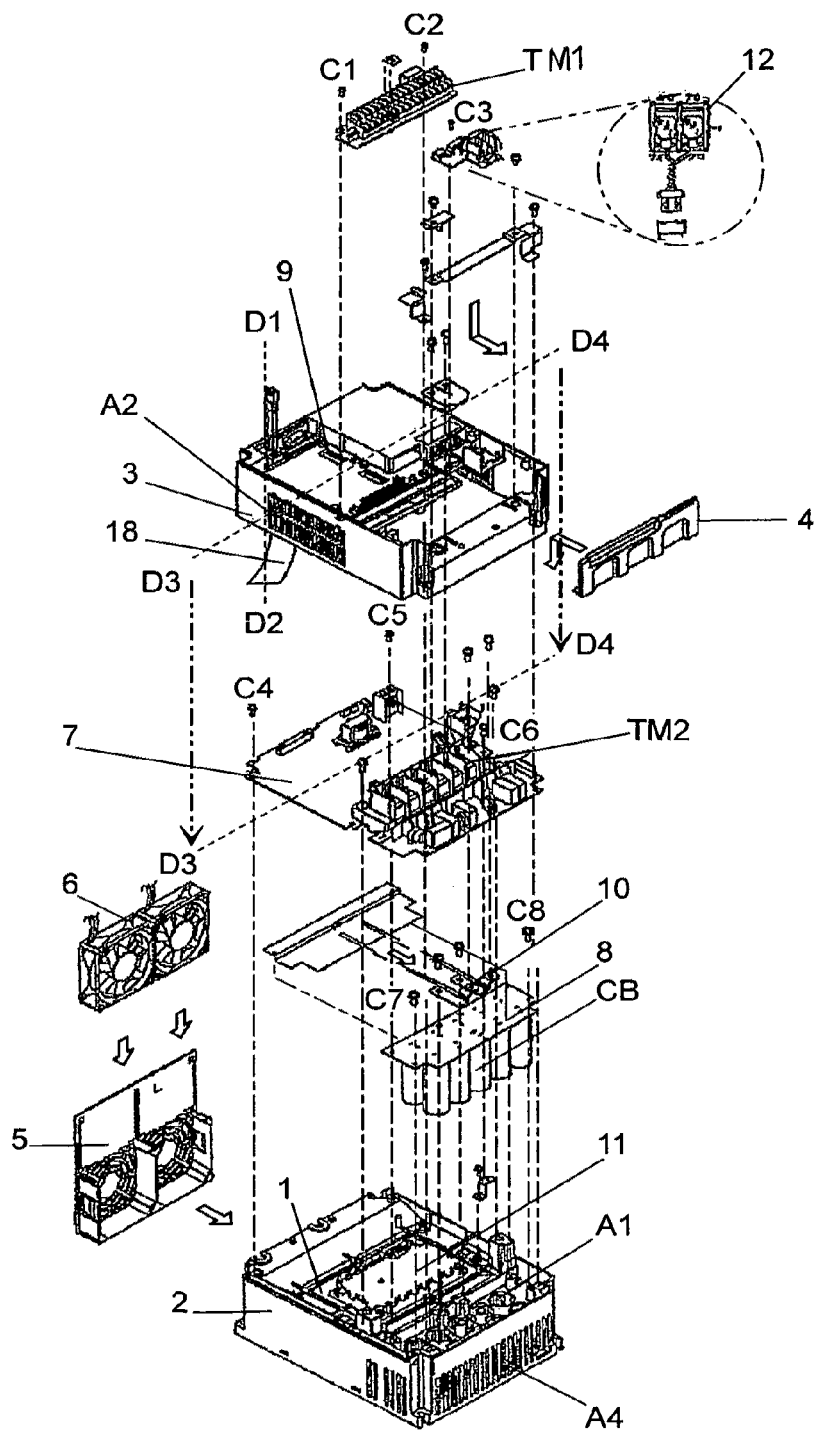
FIG. 3 is an exploded perspective view of the electric power conversion system according to an embodiment of the invention.

FIG. 3 is a detailed exploded perspective view of the electric power conversion system according to the present embodiment. While FIG. 1 is a perspective view of the electric power conversion system when it is installed, FIG. 3 is a view of the electric power conversion system during a manufacturing process, showing the perspective view of the system when horizontally oriented. That is, the cover 3 disposed at the front in FIG. 1 is seen as disposed on the upper side in FIG. 3, and the casing 2 disposed on the back side in FIG. 1 is seen as disposed on the lower side in FIG. 3. A detailed layout inside the electric power conversion system is described hereinafter with reference to FIG. 3.

In FIG. 3, the cooling fins 1, the body case (casing 2), the body cover (cover 3), a leader plate 4, a cooling-fan-mounting plate 5, and the cooling fans (fans 6), are respectively illustrated. Further illustrated are the main circuit board 7 including a driver circuit, a power supply circuit, and so forth; a substrate 8 on which main circuit electrolytic capacitors CB are mounted; a control circuit 8; and a conductor copper bar 10; respectively. A power semiconductor module (composite module 11) is mounted as a power element in the cooling fins 1.

Because a large loss occurs to the composite module 11 made up as an aggregate of power semiconductors, heat generated due to the loss is subject to thermal conduction to the cooling fins 1, whereupon the cooling fins 1 are cooled down by the cooling fans 6. The cooling fans 6 are capable of protecting the composite module 11 from being overheated due to rise in temperature. A control terminal block TM 1 is attached to the cover 3 with two screws as shown by attachment lines C1, C2, respectively. Further, the main circuit board 7 is attached to the cover 3 with three screws as shown by attachment lines C4 to C6, respectively.

Figure 5:
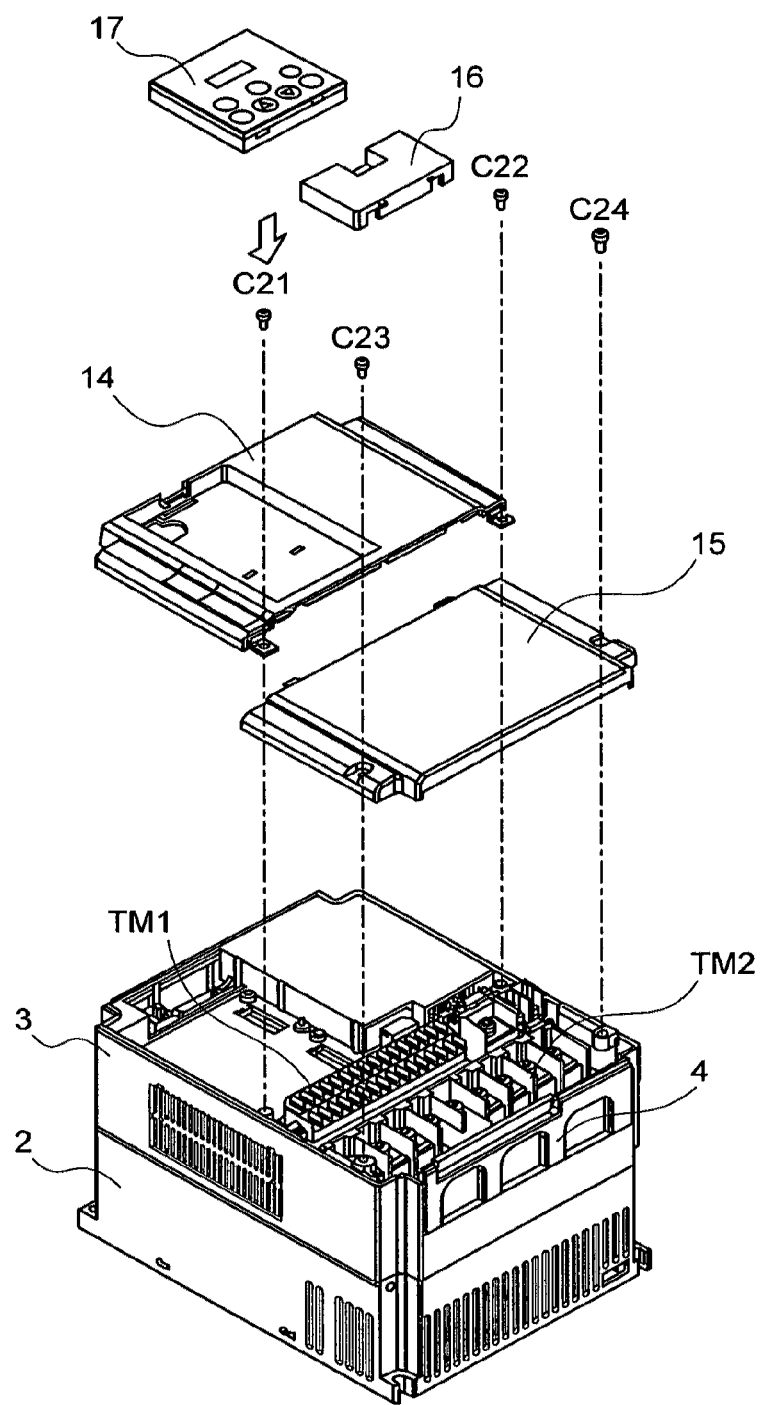
FIG. 5 is a view showing an external appearance of the electric power conversion system according to an embodiment of the invention.

Still further, the casing 2 is provided with ten holes A1 for enabling the electrolytic capacitors CB to penetrate therethrough, respectively, such that the substrate 8 for the electrolytic capacitors CB can be attached to the casing 2 with two screws as shown by attachment lines C7, C8, respectively. The cooling fans 6, each being a component having a limited lifetime, are structurally designed so that the cooling fans 6 are housed in the cooling-fan-mounting plate 5, and the cooling-fan-mounting plate 5 is fitted in the casing 2 without using screws in order to enable the cooling fans 6 to be freely removable. Thus, the electric power conversion system according to the present embodiment is configured such that the casing is provided with the composite module, the main circuit board is disposed so as to lay over the front face of the casing, and the cover (body cover 3) is disposed in such a way as to cover up the main circuit board. The casing is formed integrally with the cover by connecting the casing with the cover, thereby forming the electric power conversion system. Electrolytic capacitors CB (ten such capacitors are indicated) most vulnerable to temperature increases are disposed so as to be arranged in a lower part of the electric power conversion system. As described herein, this lower part is part of an electric power conversion system that is configured to be installed on the wall. That is, FIG. 1 is a view showing the wall-hung state in which the electric power conversion system is installed. In FIG. 5, the system is shown in an assembled state. However, when the system is actually installed, the system is set upright from this position. After installation, the electrolytic capacitors CB are disposed at the furthest location upstream of the flow of cooling air provided by the cooling fans 6 of the lower part of the system.

An inverter that is an electric power conversion system generally has a wall-hung configuration, vertically attached to a steel plate such as a panel, and the inverter is required to be small in size. To ensure the compactness of the inverter, a die-cast case with cooling fins is formed on an inner surface of a box-like member having a sidewall; power semiconductors and circuit devices, such as a control circuit and so forth, are mounted on the die-cast case, and forced air-cooling is applied to the die-cast case to check the rise in the internal temperature of the electric power conversion system.

Further, vent hole slits A4 for sucking in air from outside are provided in a lower part of the casing. As shown in FIG. 3, the system is structured such that the vent hole slits A4 are provided not only on the underside of the system but also at respective sides of a lower part of the system. The air drawn in from outside through the vent hole slits A4 is first delivered to the electrolytic capacitors, thereby sufficiently cooling the electrolytic capacitors.

As is well known in the art, an electrolytic capacitor is very susceptible to the effect of rise in temperature, and an electrolytic capacitor lifetime is drastically reduced by such a temperature rise, as is illustrated by Arrhenius' law (the law of 10° C. half-life). In contrast, in the case of the present embodiment, the electrolytic capacitors CB are disposed on the lower side of the composite module 11, which is a main heat generation source, and on the inflow side (the upstream side) of a cool wind, so that it is possible to satisfactorily check the deterioration of the electrolytic capacitors CB that may be caused by a rise in temperature caused by the heat generation source. Further, since the lifetime of consumable articles such as the electrolytic capacitors can be prolonged by the invention, it is possible to enhance reliability of the electric power conversion system while achieving the added benefit of a reduction in cost.

In the case of the present embodiment, the purpose for the use of ten lengths of the electrolytic capacitors, instead of one length thereof, is explained below. The present embodiment features a configuration in which the substrate 8 of the electrolytic capacitors and the casing 2 are shared so that variation in capacity and the input voltage of the electric power conversion system can be coped with.

Figure 4:
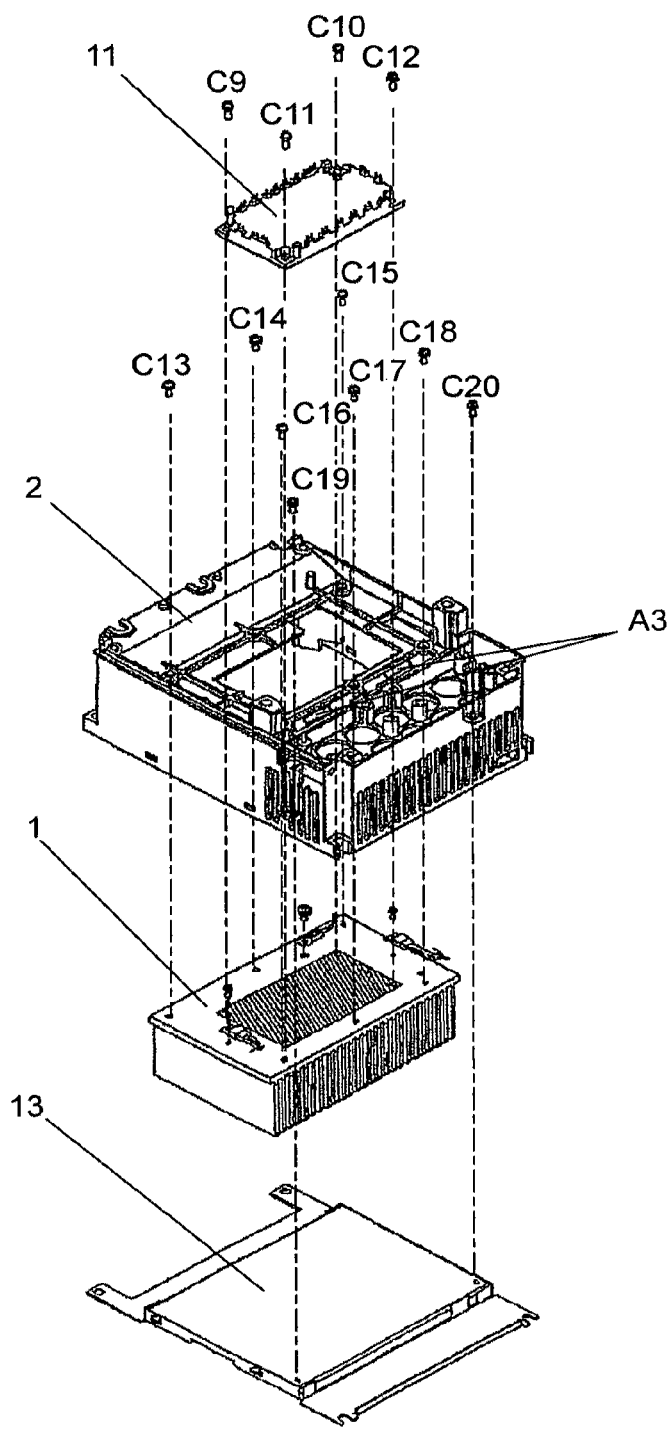
FIG. 4 is a schematic illustration showing a state in which circuit components are attached to cooling fins according to an embodiment of the invention.

FIG. 4 is a schematic illustration showing a configuration in which circuit components are attached to the cooling fins 1. The cooling fins are intended to achieve release of heat from the composite module through heat exchange, as described above. The cooling fins 1 are attached to the casing 2 with eight screws, as shown by attachment lines C13 to C20, respectively. Further, the composite module 11 is attached to the cooling fins 1 with four screws, as shown by attachment lines C9 to C12, respectively.

The notched vent holes A3 oriented in a direction substantially orthogonal to the direction of a cooling airflow (the horizontal direction when the electric power conversion system is installed) are provided in a lower part of the front face of the casing 2, that is, on the downstream side of the flow of cooling air entering through the vent hole slits A4. In the present embodiment, instead of providing shielding in order to prevent heat of the power semiconductor module from being transferred to the main circuit board containing the driver circuit, the casing is provided with the notched vent holes A3, thereby causing heat generated at the main circuit board to be circulated. That is, in order to draw air from inside the casing, the fans operate to cause air from the main circuit board to flow toward the cooling fans through the intermediary of the notched vent holes. With respect to the present embodiment, the notched vent hole A3 is provided at two spots; however, there is no limitation to the number of the notched vent holes A3, or to the area of each of the notched vent holes A3. Further, with respect to the present embodiment, the notched vent holes A3 are positioned on the lower side of the cooling fins, and the fans are provided in the upper part of the casing for the purpose of drawing the air from inside the casing and the operation of the fans drives the air from the main circuit board toward the cooling fans through the intermediary of the notched vent holes.

FIG. 5 is a view showing the external appearance of the electric power conversion system according to the present embodiment. A surface cover 14, and a terminal block cover 15 are attached to the cover 3 with two screws, respectively, as shown by attachment lines C21, C22, and C23, C24, respectively. The surface cover 14 is structured such that a digital control panel 17 is to be attached thereto after a blind cover 16 is attached thereto.

Figure 6:
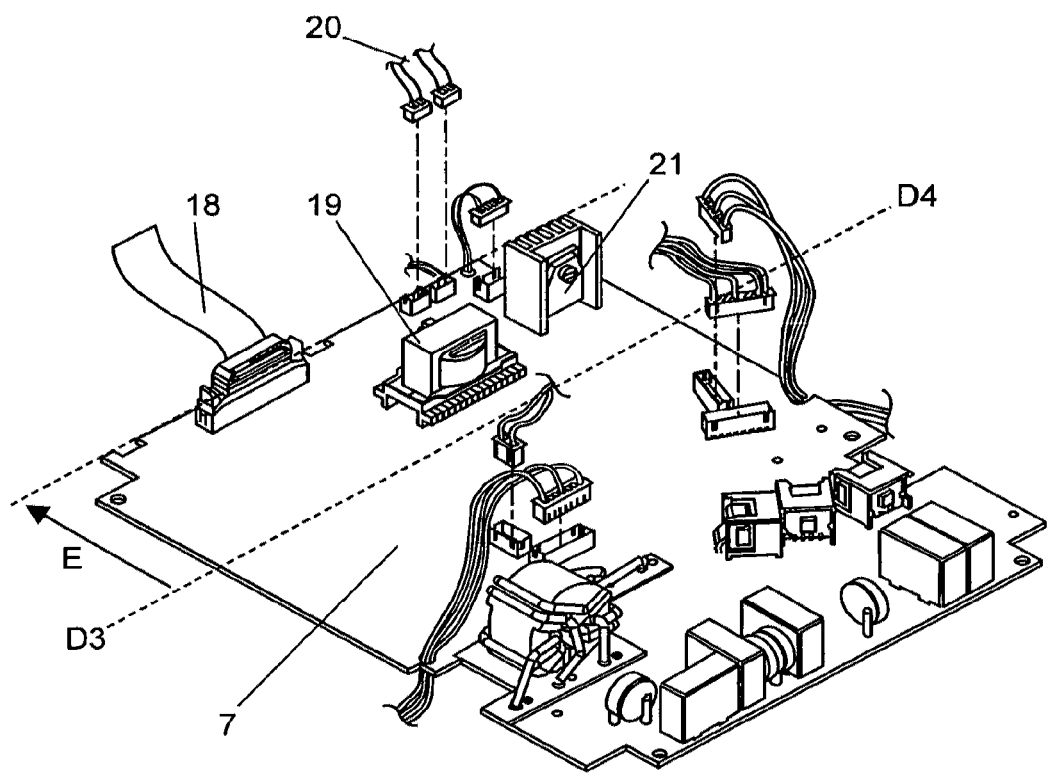
FIG. 6 is a view showing a layout of principal components of a main circuit board according to an embodiment of the invention.

FIG. 6 is a view showing a layout of principal components of the main circuit board 7. A cable 18 (see also FIG. 3) is for use as an interface with the control circuit 9. A switching transformer 19, and a switching element 21 make up a MOSFET as the fundamental component of a DC/DC converter. A cable 20 is used to supply power to the cooling fans 6.

Figure 7:
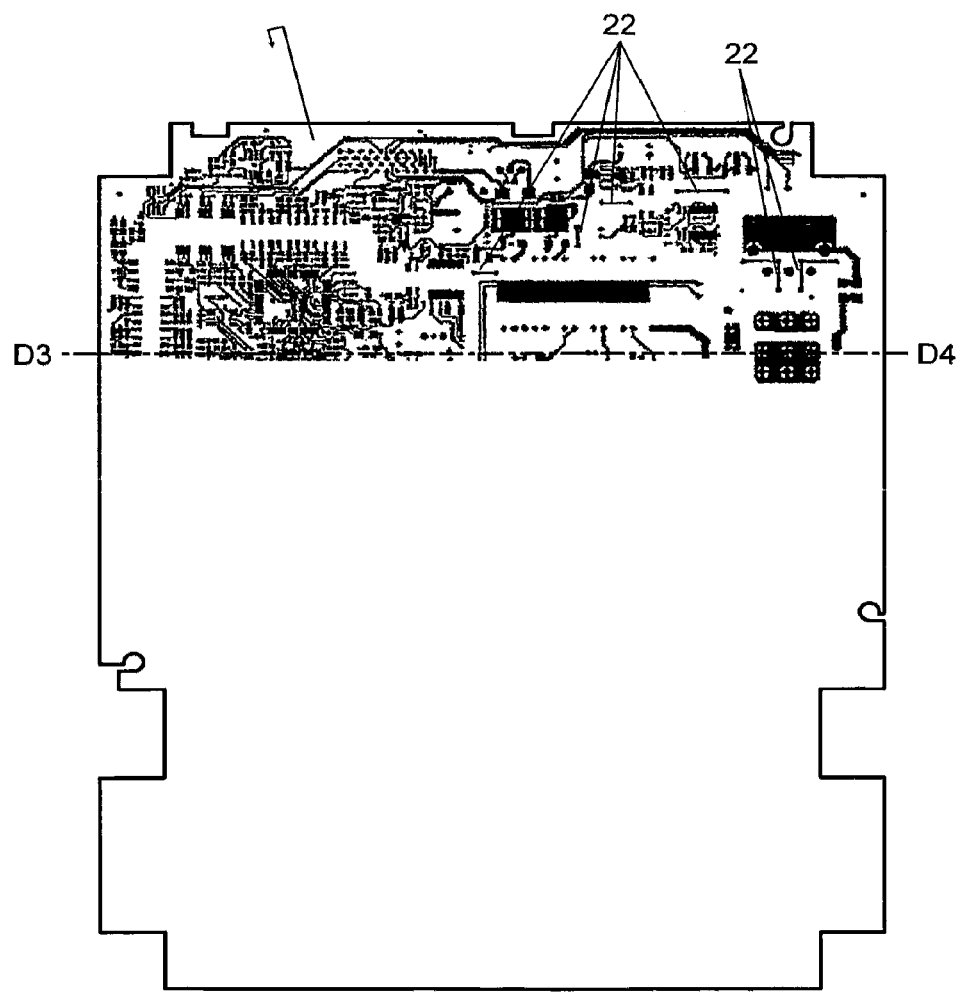
FIG. 7 is a schematic view broadly showing the main circuit board of the electric power conversion system according to an embodiment of the invention.

FIG. 7 is a schematic view broadly showing the main circuit board of the electric power conversion system according to the present embodiment. With respect to the present embodiment, a plurality of the notched through-holes 22 are provided in the main circuit board. Since the main circuit board 7 is provided with the notched through-holes 22, air present between the main circuit board 7, and the cover 3 covering the main circuit board 7 is driven to the front face of the casing through the notched through-holes 22. This flow of the air is caused by the operation of the cooling fans 6 shown in FIGS. 2 and 3, respectively. That is, with respect to the present embodiment, the main circuit board 7 is not thermally shielded from the composite module; however, since the main circuit board 7 is provided with the notched through-holes 22, and the casing is provided with the notched vent holes A3, the air from the main circuit board 7 can also be circulated and drawn out by the operation of the cooling fans 6, to thereby cause the air inside the casing to flow to the fins 1.

Further, with respect to the present embodiment, the vent hole slits A2 are provided on both the side faces of the cover 3 as shown in FIGS. 1 and 3, respectively. The exploded perspective view of FIG. 3 shows the positional relationship among the vent hole slits A2 open on both the side faces of the cover 3; the notched through-holes 22; the main circuit board 7, which is normally attached to the casing 2; and the cooling-fan-mounting plate 5 fitted to the casing 2.

A line D1-D2 in FIG. 3 indicates the uppermost part line of the vent hole slits A2. That is, D1-D2 is a line indicating the side of the vent hole slits A2 that furthest downstream of the cooling airflow, corresponding to the longitudinal direction of the casing 2. The notched through-holes 22 are also provided in parts of the main circuit board 7, corresponding to a region between the line D1-D2, and the cooling-fan-mounting plate 5. FIG. 3 further shows the uppermost part line D3-D4 of the vent hole slits A2 open on both the side faces of the cover 3, in a direction orthogonal to the vent hole slits A2, that corresponds to a projection line D3-D4 on the main circuit board 7, as shown in FIG. 7.

The region between the uppermost part line D1-D2 of the vent hole slits A2, and the cooling-fan-mounting plate 5 corresponds to a region of the main circuit board 7, indicated by an arrow line E in FIG. 6. The plurality of the notched through-holes 22 are designed to be disposed in the areas of the main circuit board 7, corresponding to the region (indicated by the arrow line E) between D1-D2, and the cooling-fan-mounting plate 5, and the purpose for this arrangement is given below.

As described in the foregoing, the notched through-holes 22 are provided on the areas of the main circuit board 7, corresponding to the region indicated by the arrow line E shown in FIG. 6, and this region corresponds to a region in the casing, on the downstream side of the cooling air from the vent hole slits A4, corresponding to the upper part of the electric power conversion system. The electric power conversion system according to the present embodiment is of the wall-hung type in structure, so that the cooling fans 6 are installed in the upper part of electric power conversion system when the system is installed.

Since heat is normally conducted from the lower side of the interior of the system toward the upper side thereof, the temperature of a constituent element is higher when positioned on the downstream side of the cooling airflow (the more upper side) of the system, while the temperature of the constituent element is lower when the constituent element is positioned on the upstream side of the cooling airflow (the more lower side). For this reason, a region around the notched through-holes 22 disposed in the upper part of the system will act as a heat reservoir, whereupon the temperature of this heat reservoir region becomes the highest inside the system. This is the reason why the notched through-holes 22 are disposed in the vicinity of components with relatively high heat loss generated by themselves among components mounted on the main circuit board. The components with relatively high heat loss generated by themselves among the components mounted on the main circuit board include the switching transformer 19, and the switching element 21, making up the MOSFET serving as the DC/DC converter, resistors (not shown), and so forth.

The positional relationship among those components and airflow will now be described with reference to FIG. 1. The notched through-holes 22 of the main circuit board 7 are provided on the upper side of the vent hole slits A2, and the notched vent holes A3 of the casing are provided on the lower side of the notched through-holes 22, and on the lower side of the cooling fans. In this configuration, air from the air-intakes flows over the upper part of the main circuit board, and subsequently, flows toward the notched vent holes A3 of the casing via the notched through-holes 22. The air is drawn out to the outside of the electric power conversion system by the fans 6 after passing through the cooling fins 1 via the notched vent holes A3. Thus, it is possible to enhance air circulation efficiency inside the system by virtue of a positional relationship among those airflow holes and air-intakes.

The function of such airflow is described hereinafter. After the cooling air drawn in from the vent hole slits A4 has cooled the electrolytic capacitors CB, as a result of the rotation of the cooling fans 6 by an induced draft method, cooling air having been drawn in from the vent hole slits A4, the cooling air flows to the cooling fins 1, whereupon heat exchange takes place. In this configuration, although heat conduction from the power semiconductors, acting as the heating elements to the cooling fins 1, has already taken place, it is possible for air, after cooling the electrolytic capacitors CB, to absorb the heat of the cooling fins, thereby effecting heat exchange because losses occurring to the power semiconductors are high.

Meanwhile, air drawn in from the vent hole slits A2, provided on both the side faces of the cover 3, is circulated inside the electric power conversion system by the cooling fans 6 that similarly execute the operation for drawing out air. First, the air passes through the notched through-holes 22 (the first airflow holes) provided in the main circuit board 7, and subsequently, flows through the space between the main circuit board, and the casing, thereafter progressing to the notched vent holes A3 (the second airflow holes). At this point in time, warm air accumulating in the vicinity of the notched through-holes 22 (the first airflow holes) can be circulated inside the system. It is therefore possible to circulate the warm air inside the system, thereby removing the accumulated heat.

Thus, with respect to the present embodiment, the air from the vent hole slits A2 (the air-intakes) flows to a first space between the main circuit board and the cover, and then continues to flow to a second space between the main circuit board and the front face of the casing. The air from the second space then flows to the interior of the casing, and is subsequently drawn out to the outside of the electric power conversion system by the fans 6. The notched through-holes 22 (the first airflow holes) whereby the first space communicates with the second space are disposed so as to be positioned on the upper side of the vent hole slits A2 (the air-intakes). Further, the second airflow holes, by which the second space communicates with the interior of the casing, are disposed so as to be positioned on the lower side of the first airflow holes, and on the lower side of the cooling fins covered by the casing.

Further, by causing the fans provided in the upper part of the casing to draw the air from inside the casing, the air from the second airflow holes is subjected to heat exchange at the cooling fins, the air subsequently being discharged to the outside of the electric power conversion system. Thus, the fans are operated so as to cause the air from the second airflow holes to flow to the cooling fins, and placement of the fans is not limited to the upper part of the casing.

Figure 8:
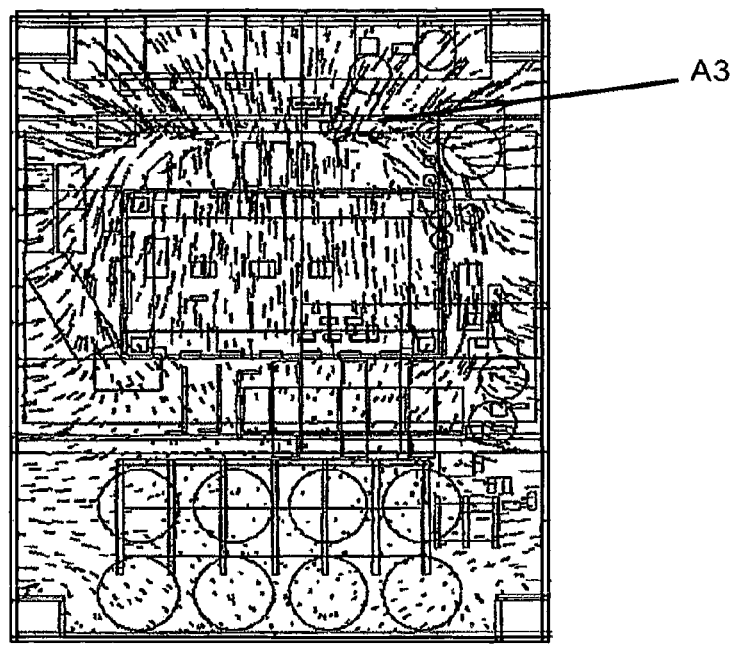
FIGS. 8(a) and 8(b) show examples of a simulation of flow rate distribution inside the system according to an embodiment of the invention.
Figure 8:
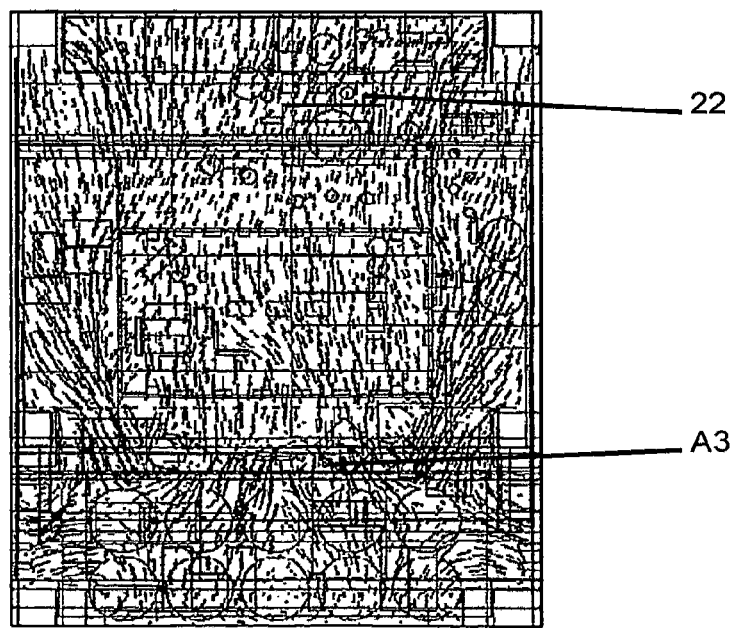

FIG. 8 is a schematic illustration showing an example of a simulation of flow rate distribution inside the casing in one embodiment of an electric power conversion system according to the invention.

FIG. 8(a) shows an example of a simulation of flow rate distribution inside an inverter, wherein the notched vent holes A3 of the casing 2 are provided on the downstream side of a cooling air so as to be oriented in a direction substantially orthogonal to the flow direction of the cooling air, and the notched through-holes 22 are not provided in the main circuit board.

FIG. 8(b) shows an example of a simulation of flow rate distribution inside an inverter according to an embodiment of the invention, wherein the notched vent holes A3 (the second airflow holes) of the casing 2 are provided on the upstream side of the cooling air (in the lower part of the system), and are oriented in a direction substantially orthogonal to the direction of the cooling airflow, and the notched through-holes 22 (the first airflow holes) are provided in the main circuit board.

In the latter case, the flow rate distribution inside the inverter shows uniform airflows throughout the device, thereby proving that stagnant warm air does not accumulate.

In order to implement the miniaturization of the system, there is a need for enhancing the density of elements mounted on the circuit board. However, temperature inside the system will be prone to rise by so doing. Accordingly, with respect to the present embodiment, the components relatively high in losses of heat generated by themselves are disposed in the region indicated by the arrow line E in FIG. 6, and the notched through-holes (the first airflow holes) are disposed in the vicinity of those components, thereby causing air surrounding those components to be circulated within the system. By so doing, the accumulation of heat can be checked as shown in the simulation of FIG. 8(b), so that it becomes possible to enhance cooling performance while attaining the miniaturization of the electric power conversion system.

As described in the foregoing, with respect to the present embodiment of the invention, it is possible to provide an electric power conversion system capable of supplying a variable voltage AC power at variable frequency to an AC motor, wherein, even if the density of the elements mounted on the circuit board is enhanced, the operation of the cooling fans (fans 6), for cooling air, can be sufficiently incorporated, and so miniaturization of the system may be satisfactorily attained without being accompanied by the risk of rise in temperature.

Figure 9:
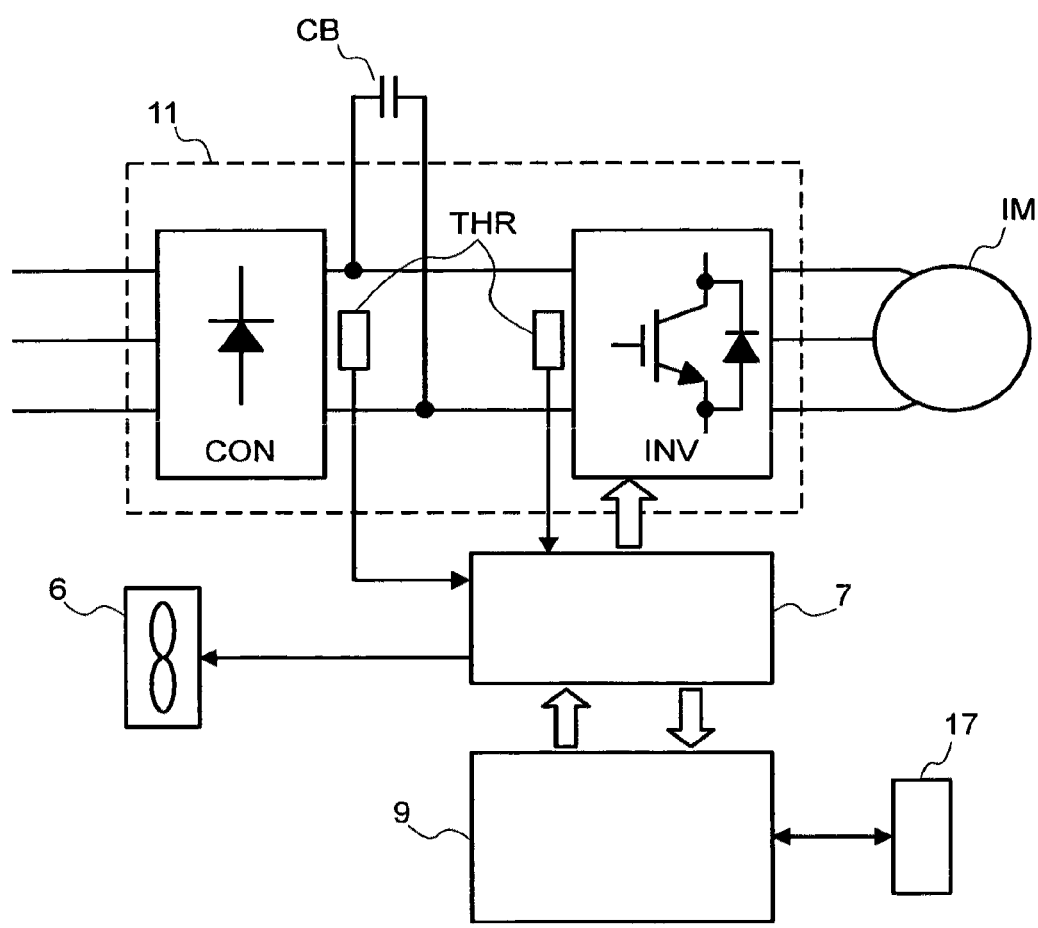
FIG. 9 is a block diagram showing a main circuit of the electric power conversion system according to an embodiment of the invention.

FIG. 9 is a block diagram of the main circuit of the electric power conversion system. The inverter according to the present embodiment is provided with a power conversion circuit including a forward-direction converter CON for converting AC power into DC power, a smoothing capacitor CB, and a reverse-direction converter INV that is capable of converting DC power into AC power at an optional frequency, and is capable of driving an AC motor IM at a desired frequency. The cooling fans 6 are installed at a position where the power modules contained in the forward-direction converter CON, and the reverse-direction converter INV, respectively, can be cooled.

Various control data blocks for the electric power conversion system can be set, and changed via the control panel 17. The control panel 17 is provided with a display screen capable of showing an abnormal display, and if any abnormality in the electric power conversion system is detected, this will be shown on the display screen. There is no particular limitation to the type of the control panel 17 according to the present embodiment; however, the control panel of the present embodiment is constructed so as to enable a user to operate a digital control panel while looking at a display on the display screen. Further, the display screen need not necessarily be integrated into the control panel 17, but the display screen is preferably made up integrally with the control panel 17 such that an operator of the control panel 17 can operate the panel while looking at a display on the display screen. The various control data blocks for the electric power conversion system, inputted from the control panel 17, are stored in a memory (not shown).

Temperature detectors THM each detect the temperature of each of the power modules incorporated in the forward-direction converter CON, and the reverse-direction converter INV, respectively. For the temperature detector THM, either a temperature relay with an output contact being turned ON/OFF at a predetermined temperature, or a thermistor with a resistance value variable according to temperature, may be used. Furthermore, either a thermistor characterized by a resistance value that increases with a rise in temperature, or a thermistor characterized by a resistance value that decreases with a rise in temperature, may be used.

With respect to the present embodiment, the control circuit 9 takes charge of controlling the inverter as a whole. The control circuit 9 executes control processing necessary for the whole system, and controls the switching element of the reverse-direction converter INV on the basis of the various control data blocks inputted from the control panel 17. Mounted on the control circuit 9 is a microcomputer (control processor) for executing operation on the basis of data stored in the memory where the various control data blocks are stored, but description of an internal configuration thereof is omitted.

The driver circuit drives the switching element of the reverse-direction converter INV on the basis of a command from the control circuit 9. Further, a switching regulator circuit (DC/DC converter) is mounted on the driver circuit, generating various DC voltages to be supplied to respective constituent elements and which are necessary for the operation of the electric power conversion system.

What is claimed is:

1. An electric power conversion system provided with a casing, with a front face thereof, for covering cooling fins for cooling power semiconductors, a main circuit board having a driver circuit for driving the power semiconductors, disposed on a side of the front face of the casing, opposite from the cooling fins, and a cover combined with the casing, for covering the main circuit board, said system comprising:

an airflow hole provided at a part in the front face of the casing, on the lower side of the cooling fins, for causing air from the main circuit board to flow therethrough within the casing, and a cooling fan for causing air from the airflow hole to flow to the cooling fins;

a smoothing capacitor provided on the downstream side of the airflow hole; and an air-intake provided on the lower side of the smoothing capacitor, wherein the cooling fan causes air flowing from the air-intake to the smoothing capacitor to further flow to the cooling fins.

2. The electric power conversion system according to claim 1, wherein the airflow hole is oriented so as to cause air to flow in the horizontal direction.

3. An electric power conversion system provided with a casing, with a front face thereof, for covering cooling fins for cooling power semiconductors, a main circuit board having a driver circuit for driving the power semiconductors, disposed on a side of the front face of the casing, opposite from the cooling fins, and a cover combined with the casing, for covering the main circuit board, from a side of the main circuit board, opposite from the front face, said system comprising:

a first space between the main circuit board, and the cover;

a second space between the main circuit board, and the front face;

a first airflow hole through which the first space communicates with the second space, provided at a part of the main circuit board, on an upper part of an air-intake provided in the cover;

a second airflow hole through which the second space communicates with the interior of the casing, provided at a part in the front face of the casing, on the lower side of the first airflow hole, and on the lower side of the cooling fins; and a cooling fan for causing air from the second airflow hole to flow to the cooling fins.

4. The electric power conversion system according to claim 3, wherein a switching element used in the driver circuit is disposed at a part of the main circuit board, on the upper side of the air-intake.

5. The electric power conversion system according to claim 3, wherein the cooling fan is disposed on the upper side of the cooling fins to cause the air from the main circuit board to flow to the cooling fins through the first airflow hole.

6. The electric power conversion system according to claim 5, wherein the casing has an air-intake for causing the air from outside to flow to the cooling fins, provided on the lower side of the first airflow hole provided on the front face of the casing.

7. The electric power conversion system according to claim 6, wherein the casing has an electrolytic capacitor provided on a downstream side of the first airflow hole provided on the front face of the casing, and on the upper side of the air-intake provided in the casing, the fan causing the air from outside to flow to the electrolytic capacitor through the air-intake.

8. The electric power conversion system according to claim 7, wherein the main circuit board has a switching element used in the driver circuit, on the upper side of the air-intake provided in the cover.

* * * * *